United States Patent [19]
Kotake

[11] Patent Number: 5,843,602
[45] Date of Patent: Dec. 1, 1998

[54] METHOD OF ADJUSTING CONCENTRATION OF DEVELOPER THROUGH LOAD CELL UTILIZATION AND WET NITROGEN GAS ATMOSPHERE

[75] Inventor: Koichi Kotake, Kanagawa, Japan

[73] Assignee: Tokyo Ohka Kogyo Co., Ltd., Kanagawa, Japan

[21] Appl. No.: 586,543

[22] Filed: Jan. 16, 1996

Related U.S. Application Data

[63] Continuation of Ser. No. 90,415, Jul. 12, 1993, abandoned.

[30] Foreign Application Priority Data

Jul. 10, 1992 [JP] Japan .................................. 4-207431

[51] Int. Cl.$^6$ ...................................................... G03C 5/00
[52] U.S. Cl. ............................... 430/30; 430/331; 23/306
[58] Field of Search ........................ 430/30, 331; 23/306

[56] References Cited

U.S. PATENT DOCUMENTS

| | | | |
|---|---|---|---|
| 4,024,885 | 5/1977 | Linthout | 430/30 |
| 4,724,795 | 2/1988 | Levine | 118/688 |
| 4,836,685 | 6/1989 | Verreault | 366/141 |
| 4,882,246 | 11/1989 | Ohba et al. | 430/30 |
| 5,026,467 | 6/1991 | Matsuoka | 204/194 |

FOREIGN PATENT DOCUMENTS

| | | |
|---|---|---|
| 3612692 | 12/1986 | Germany . |
| 4003119 | 8/1990 | Germany . |
| 3921564 | 1/1991 | Germany . |
| 5921022 | 5/1984 | Japan . |
| 59184221 | 3/1986 | Japan . |
| 634236 | 6/1988 | Japan . |
| 1027624 | 1/1989 | Japan . |
| 6230037 | 1/1989 | Japan . |
| 5216241 | 8/1993 | Japan . |

*Primary Examiner*—Christopher G. Young
*Attorney, Agent, or Firm*—Weiner, Carrier, Burt & Esser, P.C.; Joseph P. Carrier

[57] ABSTRACT

The concentration of a developer for use in developing resists in the fabrication of integrated circuits of semiconductors is adjusted highly accurately using a load cell. A stock developer and pure water are supplied to a mixing tank supported on a load cell, and mixed into a diluted developer in the mixing tank. The concentration of the diluted developer from the mixing tank is analyzed by an automatic analyzer, which then calculates the weight of a stock developer or pure water to be introduced into the mixing tank based on the analyzed concentration in order to achieve a predetermined concentration. Then, either a stock developer or pure water of the calculated weight is supplied to the mixing tank until the weight, as measured by the load cell, of the mixing tank containing the stock developer and the pure water is increased by the calculated weight. Thereafter, the diluted developer is transferred from the mixing tank to a reservoir tank, while both tanks are maintained under a nitrogen gas atmosphere.

13 Claims, 1 Drawing Sheet

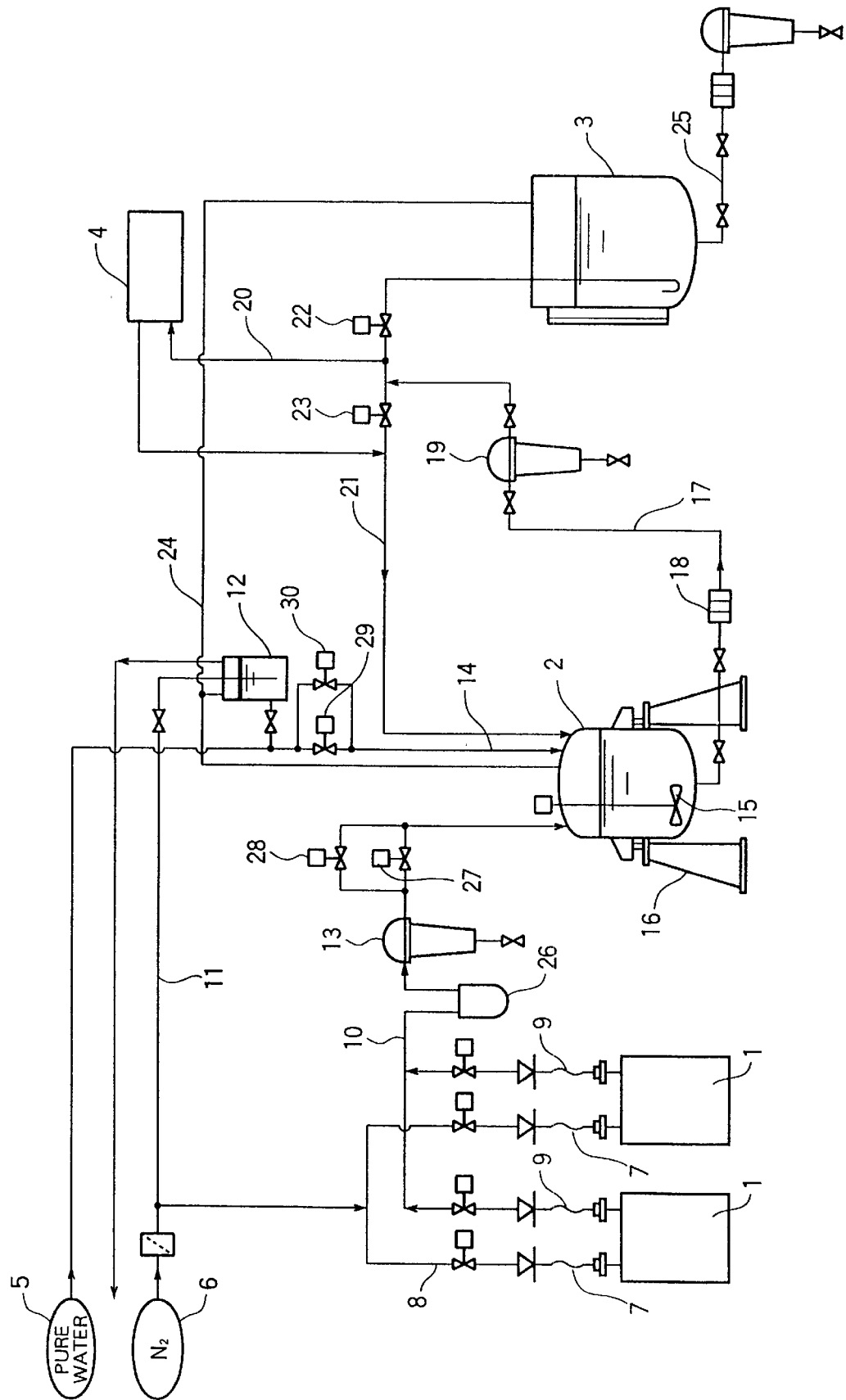

METHOD OF ADJUSTING CONCENTRATION OF DEVELOPER THROUGH LOAD CELL UTILIZATION AND WET NITROGEN GAS ATMOSPHERE

This is a file wrapper continuation of prior application Ser. No. 08/090,415 filed Jul. 12, 1993 (now abandoned).

BACKGROUND OF THE INVENTION

1. Field of the Invention

The present invention relates to a method of diluting a high-concentration stock developer to a predetermined concentration.

2. Description of the Relevant Art

Some processes of fabricating integrated circuits of semiconductors include a photoetching step in which a resist that has been exposed to light is developed with a developer. In the developing procedure, the concentration of the developer used should be highly accurately controlled with respect to each of the resists to be developed in order to minimize any differences between the effective sensitivities of the resists.

It is inefficient and time-consuming to accurately control the concentration of the developer in factories where integrated circuits of semiconductors are fabricated. It has been customary for a developer manufacturer to dilute a high-concentration stock developer to a desired concentration and supply the diluted developer to the factories.

Heretofore, the stock developer has been diluted five to ten times with pure water. Such a practice is disadvantageous because the cost of the developer is increased by the use of the number of returnable cans and high transportation expenses. Another problem is that since the factories that consume the developer do not dilute any stock developer, they tend to suffer inventory control difficulties resulting from a loss of developers of desired concentrations and an oversupply of developers of unwanted concentrations.

The developer which has been diluted by the developer manufacturer is liable to become modified in nature during shipment and storage.

Japanese Laid-Open Patent Publication No. 61-61164 discloses a conventional process of supplying a developer replenisher to keep active a developer that is used in a photosensitive lithographic process. The amount of developer replenisher to be added to the developer is determined by measuring the conductivity of the developer which is indicative of the deterioration of the developer.

Japanese Laid-Open Patent Publication No. 64-7624 discloses an apparatus for diluting a stock developer with pure water. The stock developer and the pure water are supplied to a mixer, from which a mixed solution flows into a stirring tank. The rate at which the stock developer or the pure water flows to the mixer is controlled based on the conductivity of the mixed solution that is extracted from the stirring tank.

SUMMARY OF THE INVENTION

It is an object of the present invention to provide a method of diluting a high-concentration stock developer highly accurately to a desired concentration.

According to the present invention, there is provided a method of adjusting the concentration of a developer, comprising supplying a stock developer and pure water to a mixing tank supported on a load cell, mixing the stock developer and the pure water into a diluted developer in the mixing tank, analyzing the concentration of the diluted developer from the mixing tank, calculating the weight of a stock developer or pure water to be introduced into the mixing tank based on the analyzed concentration in order to achieve a predetermined concentration, supplying either a stock developer or pure water of the calculated weight to the mixing tank until the weight, as measured by the load cell, of the mixing tank containing the stock developer and the pure water is increased by the calculated weight, and thereafter transferring the diluted developer from the mixing tank to a reservoir tank.

With the above method, a developer user may be supplied with only a high-concentration stock developer from a developer manufacturer or supplier, and prepare a diluted developer. Therefore, the cost of shipment of the developer is relatively low because it is not necessary for the developer manufacturer to supply a diluted developer to the developer user. Inasmuch as the developer user can produce a desired amount of diluted developer at any time, the developer user is not required to keep a large amount of diluted developer for a long period of time, and hence is free of the risk of modification of a diluted developer in storage.

The stock developer can be diluted highly accurately to a desired concentration because the desired concentration is achieved by measuring, with the load cell, the weight of the mixing tank containing the stock developer and the pure water. This concentration control process can achieve more accurate concentration than if a pump for delivering the stock developer or the pure water to the mixing tank were controlled to control an additional amount of stock developer or pure water to be supplied to the mixing tank.

The above and further objects, details and advantages of the present invention will become apparent from the following detailed description of a preferred embodiment thereof, when read in conjunction with the accompanying drawings.

BRIEF DESCRIPTION OF THE DRAWINGS

The sole figure is a schematic diagram of a diluting apparatus for carrying out a method of diluting a stock developer according to the present invention.

DETAILED DESCRIPTION OF THE PREFERRED EMBODIMENT

As shown in the sole figure, a diluting apparatus for carrying out a diluting method according to the present invention has returnable cans 1, a mixing tank 2, a reservoir tank 3, an automatic analyzer 4, a pure water supply 5, and a nitrogen gas supply 6.

Each of the returnable cans 1 contains a high-concentration stock developer manufactured by a developer manufacturer. The returnable cans 1 are connectable by joints 7 to a pipe 8 from the nitrogen gas supply 6, and by joints 9 to a pipe 10 leading to the mixing tank 2. From the nitrogen gas supply 6, there also extends a pipe 11 leading to a bubbling tank 12 that is connected to the mixing tank 2 and the reservoir tank 3. The bubbling tank 12 generates a nitrogen gas atmosphere with a water content which is supplied to upper spaces defined in the respective mixing and reservoir tanks 2, 3.

An auxiliary tank 26, a filter unit 13, and an air valve 27 are successively connected in the pipe 10. The auxiliary tank 26 is associated with a level sensor. The air valve 27 is capable of controlling a large developer flow. Another air valve 28 for finely adjusting a developer flow is connected in bypassing relationship to the air valve 27. When a stock developer is charged into the mixing tank 2, the air valve 27 is used to control the flow of stock developer until a predetermined amount of stock developer is supplied to the mixing tank 2. Thereafter, the air valve 28 is used to adjust the flow of stock developer so that an accurate amount of stock developer is supplied to the mixing tank 2.

Similarly, an air valve 29 for controlling a large pure water flow is connected in a pipe 14 extending from the pure water supply 5 to the mixing tank 2. An air valve 30 for finely adjusting a pure water flow is connected in by-passing relationship to the air valve 29. The air valves 29, 30 are selectively used to supply an accurate amount of pure water to the mixing tank 2 for easily and accurately adjusting the concentration of a diluted developer in the mixing tank 2.

The level sensor combined with the auxiliary tank 26 is capable of detecting when either one of the returnable tanks 1 becomes empty. When one of the returnable tanks 1 becomes empty as detected by the level sensor, the stock developer starts being supplied from the other returnable tank 1 without any appreciable delay so that the stock developer can continuously be supplied to the mixing tank 2.

The mixing tank 2 has a stirring device 15 for mixing the stock developer supplied from the pipe 10 and the pure water supplied from the pipe 14. The mixing tank 2 is supported on a load cell 16, which measures the total weight of the mixing tank 2 that contains the stock developer and the pure water that have been supplied thereto.

The mixing tank 2 and the reservoir tank 3 are connected to each other by a supply pipe 17 for supplying a diluted or concentration-adjusted developer from the mixing tank 2 to the reservoir tank 3. A pump 18 and a filter unit 19 are connected in the supply pipe 17, and a pipe 20 is branched from the supply pipe downstream of the filter unit 19 and connected to the automatic analyzer 4. The automatic analyzer 4 is connected to the mixing tank 2 by a return pipe 21. A shut-off valve 22 is connected in the supply pipe 17 downstream of the junction where the pipe 20 is branched from the supply pipe 17, and another shut-off valve 23 is connected in a pipe that interconnects the supply pipe 21 and the return pipe 21.

The upper spaces in the mixing and reservoir tanks 2, 3 and the bubbling tank 12 are interconnected by a communication pipe 24. The nitrogen gas atmosphere which is introduced from the bubbling tank 12 into the upper spaces in the mixing and reservoir tanks 2, 3 through the communication pipe 24 serves to prevent the developer in the mixing and reservoir tanks 2, 3 from being deteriorated. A pipe 25 extends from the bottom of the reservoir tank 3 for supplying the diluted developer from the reservoir tank 3 to locations where the diluted developer will be used.

Now, a process of diluting a stock developer to a desired concentration will be described below.

First, a stock developer is supplied from one of the returnable cans 1 to the mixing tank 2 through the pipe 10, and pure water is supplied from the pure water supply 5 to the mixing tank 2 through the pipe 14. The amount of pure water to be supplied to the mixing tank 2 is selected to be substantially commensurate with a desired dilution ratio.

Then, the stirring device 15 is actuated to mix the developer and the pure water uniformly in the mixing tank 2. A portion of the mixed solution, i.e., the diluted developer, is supplied to the automatic analyzer 4 through the supply pipe 17 and the pipe 20 while the shut-off valves 22, 23 are closed. The automatic analyzer 4 measures the concentration of the diluted developer that has been supplied thereto using any of various known chemical or physical processes.

After having analyzed the concentration of the diluted developer, the automatic analyzer 4 calculates the weight of the stock developer or pure water to be introduced into the mixing tank 2 based on analyzed concentration so that a desired developer concentration will be achieved. Then, either the stock developer or pure water of the calculated weight is supplied from the returnable tank 1 or the pure water supply 5 to the mixing tank 2. At this time, the weight of the mixing tank 2 containing the diluted developer is measured by the load cell 16 to determine whether the calculated weight of stock developer or pure water has been added to the mixing tank 2 or not.

When the weight of the mixing tank 2 as measured by the load cell 16 is increased by the calculated weight, the supply of the stock developer or pure water to the mixing tank 2 is stopped. Then, the stock developer and the pure water are uniformly mixed in the mixing tank 2 by the stirring device 15. A portion of the mixed solution or diluted developer is supplied again to the automatic analyzer 4 which confirms whether the concentration of the diluted developer falls within a preset concentration range. Thereafter, the valve 22 is opened and the pump 18 is operated to transfer the diluted developer from the mixing tank 2 through the supply pipe 17 to the reservoir tank 3. The process of adjusting the concentration of the developer or diluting the stock developer is now finished.

The above process allows a developer user to be supplied with only a high-concentration stock developer from a developer manufacturer or supplier. Therefore, the cost of shipment of the developer is relatively low because it is not necessary for the developer manufacturer to supply a diluted developer to the developer user. Inasmuch as the developer user can produce a desired amount of diluted developer at any time, the developer user is not required to keep a large amount of diluted developer for a long period of time, and hence is free of the risk of modification of a diluted developer in storage. The diluted developer is further prevented from being undesirably modified by the netrogen gas atmosphere maintain in the tanks 2,3.

According to the above diluting process, the stock developer can be diluted highly accurately to a desired concentration because the desired concentration is achieved by measuring, with the load cell, the weight of the mixing tank containing the stock developer and the pure water.

Although there has been described what is at present considered to be the preferred embodiment of the invention, it will be understood that the invention may be embodied in other specific forms without departing from the essential characteristics thereof. The present embodiment is therefore to be considered in all respects as illustrative, and not restrictive. The scope of the invention is indicated by the appended claims rather than by the foregoing description.

What is claimed is:

1. A method of adjusting the concentration of a developer, comprising:

supplying a nitrogen gas atmosphere through a bubbling tank to a mixing tank and a reservoir tank and maintaining a wet nitrogen gas atmosphere in said mixing and reservoir tanks;

supplying a stock developer and pure water to said mixing tank supported on a load cell;

mixing the stock developer and the pure water into a diluted developer in said mixing tank;

analyzing the concentration of the diluted developer contained in said mixing tank;

calculating a weight of a stock developer or pure water to be introduced into said mixing tank based on the analyzed concentration in order to achieve a predetermined concentration;

supplying either said stock developer or pure water to said mixing tank until a weight, as measured by said load cell, of the mixing tank containing the stock developer and the pure water is increased by the calculated weight, said stock developer or said pure water being supplied to said mixing tank at a higher rate and then at a lower rate until a predetermined amount of the stock developer or pure water is introduced into said mixing tank; and thereafter transferring the diluted developer from the mixing tank to said reservoir tank.

2. A method according to claim 1, further comprising the step of:

supplying the stock developer selectively from a plurality of returnable tanks to said mixing tank.

3. A method according to claim 1, further comprising the step of:

supplying the diluted developer from said mixing tank to an analyzer through a pipe to analyze the concentration of the diluted developer.

4. A method according to claim 3, further comprising the step of:

transferring the diluted developer from the mixing tank to the reservoir tank through said pipe.

5. A method according to claim 2, further comprising the step of:

monitoring an amount of stock developer in said tanks; and said step of supplying the stock developer selectively from a plurality of returnable tanks to said mixing tank is effected substantially continuously based on the monitored condition of said tanks.

6. A method for generating a ready supply of diluted developer at a highly accurate concentration, comprising the steps of:

supplying a nitrogen gas atmosphere through a bubbling tank to a mixing tank and a reservoir tank and maintaining a wet nitrogen gas atmosphere in said mixing and reservoir tanks;

supplying an approximate amount of stock developer and an approximate amount of diluent to said mixing tank;

mixing said stock developer and diluent into a diluted developer in said mixing tank;

monitoring a weight of said diluted developer in said mixing tank using a load cell;

determining an initial concentration of said diluted developer;

calculating an amount of at least one of said stock developer and said diluent to be introduced into said mixing tank based on the determined initial concentration of said diluted developer and a predetermined desired concentration of diluted developer;

supplying an additional amount of at least one of said stock developer and said diluent to said mixing tank until the monitored weight of said diluted developer is increased by said calculated amount;

said stock developer and said diluent being supplied at higher rates and then at lower rates until predetermined amounts thereof are introduced into said mixing tank; and thereafter transferring the diluted developer from the mixing tank to said reservoir tank as a ready supply of diluted developer.

7. A method according to claim 6, wherein said stock developer is a resist developer and said diluent is pure water.

8. A method according to claim 6, wherein said stock developer and said diluent are both liquids, said stock developer and diluent are supplied to said mixing tank under a nitrogen gas atmosphere, and said diluted developer in said mixing tank and in said reservoir tank are maintained under a the wet nitrogen gas atmosphere.

9. A method according to claim 6, wherein said higher and lower flow rates being achieved using a plurality of flow control valves disposed in parallel.

10. A method according to claim 6, further comprising the step of:

supplying said stock developer to said mixing tank selectively and individually from a plurality of reusable containers.

11. A method according to claim 10, further comprising the step of:

monitoring an amount of stock developer contained in one of said reusable tanks; and said step of supplying the stock developer to said mixing tank is effected substantially continuously based on the monitored amount of the stock developer in said one usable container.

12. A method according to claim 6, wherein said step of monitoring the weight of diluted developer is measured using a load cell to measure a weight of the mixing tank containing the stock developer and diluent.

13. A method according to claim 6, wherein said step of determining the concentration of the diluted developer is achieved using an analyzer disposed remotely from said mixing tank, said diluted developer is supplied from said mixing tank to said analyzer through a same pipe which is used for transferring the diluted developer from the mixing tank to the reservoir tank.

* * * * *

UNITED STATES PATENT AND TRADEMARK OFFICE
CERTIFICATE OF CORRECTION

PATENT NO. : 5,843,602
DATED : 01 December 1998
INVENTOR(S) : Koichi Kotake It is certified that error appears in the above-identified patent and that said Letters Patent is hereby corrected as shown below:

Column 1, line 15, delete "the";
        line numbered approximately 49, change "64-7624" to --64-27624--.
Column 3, line 39, change "supply pipe 21" to --supply pipe 17--.
Column 4, 38th printed line, change "netrogen" to --nitrogen--;
        39th printed line, change "maintain" to --maintained--.
Column 6, line numbered between 23 and 24 (22nd printed line), change "a the wet" to --the wet--;
        line numbered between 40 and 41 (38th printed line), change "usable" to --reusable--.

Signed and Sealed this

Thirteenth Day of April, 1999

Attest:

Q. TODD DICKINSON

*Attesting Officer*        *Acting Commissioner of Patents and Trademarks*